United States Patent
Gu et al.

(10) Patent No.: US 9,096,024 B2
(45) Date of Patent: Aug. 4, 2015

(54) UV CURABLE RESIN EMBOSSING APPARATUS AND METHOD FOR ROLL TO ROLL ALIGNMENT

(71) Applicant: SUZHOU MONS-WAY PHOTOELECTRIC TECHNOLOGY LIMITED COMPANY, Suzhou, Jiangsu (CN)

(72) Inventors: Ying Gu, Nanchang (CN); Yulong Gao, Nanchang (CN); Zheng Cui, Suzhou (CN)

(73) Assignee: SUZHOU MONS-WAY PHOTOELECTRIC TECHNOLOGY LIMITED COMPANY, Suzhou, Jiangsu (CN)

( * ) Notice: Subject to any disclaimer, the term of this patent is extended or adjusted under 35 U.S.C. 154(b) by 0 days.

(21) Appl. No.: 14/000,202
(22) PCT Filed: Dec. 20, 2012
(86) PCT No.: PCT/CN2012/087081
§ 371 (c)(1),
(2) Date: Aug. 16, 2013
(87) PCT Pub. No.: WO2014/079122
PCT Pub. Date: May 30, 2014

(65) Prior Publication Data
US 2014/0329028 A1 Nov. 6, 2014

(51) Int. Cl.
*B29C 59/02* (2006.01)
*B29C 70/78* (2006.01)
(Continued)

(52) U.S. Cl.
CPC ........... *B29C 70/78* (2013.01); *B29C 71/04* (2013.01); *G03F 7/0002* (2013.01); *B29C 59/02* (2013.01); *B29C 2035/0827* (2013.01)

(58) Field of Classification Search
CPC ......... G03F 7/00; B29C 59/02; B29C 59/046; B29C 70/78; B29C 71/04; B29C 2035/0827
See application file for complete search history.

(56) References Cited

U.S. PATENT DOCUMENTS 6,309,580 B1 * 10/2001 Chou ............................ 264/338
7,291,564 B1 * 11/2007 Jackson ........................ 438/706
(Continued)

FOREIGN PATENT DOCUMENTS

| CN | 101943859 A | 1/2011 |
| CN | 102602208 A | 7/2012 |

(Continued)

OTHER PUBLICATIONS

Office Action in corresponding Japanese Application No. 2014-547702; dated Feb. 3, 2015; 5 pages.
(Continued)

*Primary Examiner* — James Mackey
(74) *Attorney, Agent, or Firm* — Haynes Beffel & Wolfeld LLP; James F. Hann

(57) ABSTRACT

A UV forming apparatus and method for roll to roll alignment is disclosed. The apparatus comprises an unrolling mechanism (101), a coating mechanism (102), a UV forming mechanism (100), a stripping mechanism (107) and a withdraw roll mechanism (110); wherein the apparatus further comprises an adjusting alignment mechanism (10) comprising a flat mold supporting apparatus (116) and an alignment probe (108), the flat mold supporting apparatus (116) is capable of adjusting the position of the flat mold at three degrees of freedom including horizontal, vertical, and angle; the mold (112) is disposed on the flat mold supporting apparatus, the UV forming mechanism (100) and the adjusting alignment mechanism (10) are fixed to the forming apparatus. The present disclosure eliminates the influence of the cumulative error and the bubbles to patterns in the alignment procedure during production.

3 Claims, 2 Drawing Sheets

(51) Int. Cl.
*G03F 7/00* (2006.01)
*B29C 71/04* (2006.01)
*B29C 35/08* (2006.01)

(56) References Cited

U.S. PATENT DOCUMENTS

| | | | |
|---|---|---|---|
| 7,293,973 B2 * | 11/2007 | Lee et al. | 425/192 R |
| 7,670,127 B2 * | 3/2010 | Heidari | 425/385 |
| 7,798,802 B2 * | 9/2010 | Cho et al. | 425/385 |
| 8,016,585 B2 * | 9/2011 | Komoriya et al. | 425/385 |
| 8,033,814 B2 * | 10/2011 | Bailey et al. | 425/385 |
| 8,096,802 B2 * | 1/2012 | Mori et al. | 425/385 |
| 8,535,035 B2 * | 9/2013 | Mori et al. | 425/174.4 |
| 2011/0005412 A1 * | 1/2011 | Fujii et al. | 101/216 |
| 2012/0301569 A1 | 11/2012 | Hasegawa et al. | |

FOREIGN PATENT DOCUMENTS

| | | | |
|---|---|---|---|
| EP | 1460738 | * | 9/2004 |
| JP | 2010105314 A | | 5/2010 |
| JP | 2010221454 A | | 10/2010 |
| WO | 2011089836 A1 | | 7/2011 |
| WO | 2011155582 A1 | | 12/2011 |

OTHER PUBLICATIONS

Office Action in corresponding Taiwan Application No. 10420059580; dated Jan. 16, 2015; 3 pages.

* cited by examiner

UV CURABLE RESIN EMBOSSING APPARATUS AND METHOD FOR ROLL TO ROLL ALIGNMENT

FIELD OF THE INVENTION

The present disclosure relates generally to an embossing forming apparatus technology field, more specifically, to a UV curable resin embossing apparatus and method for roll to roll alignment.

BACKGROUND OF THE INVENTION

UV embossing is a technology of disposing UV curing material between a mold and substrate, pressing the material into the undulating mold structure under pressure, and copying the mold via stripping after UV curing. Embossing and more specifically, nano-embossing plays an irreplaceable role in graphical production (e.g. optical film, anti-counterfeit labels, CD, MEMS and etc.). It is an important researching object in optical display, information storage, biological medicine and other high-tech fields. Compared to other micro-nano processing means (e.g. UV lithography, electron beam and ion beam lithography), nano-embossing has the advantages of simple operation, high resolution, and good repetition.

At present, technology of single-side embossing on a surface of substrate has been very mature. Patterns with less than 100 nm line width may be produced via single-side embossing apparatus with a flat or curved surface mold. But in some areas such as double anti-counterfeiting label, single-side embossing technology can no longer meet the requirements. In these areas, double-side embossing technology mainly comprises the following two types:

One is double-side embossing technology with 2 rollers, which is based on the principle of single-side embossing with a curved surface mold, wherein two coated curved surface mold or directly carved pattern rollers are disposed on an apparatus, for embossing on a positive and negative side respectively. The method can implement rapidly roll to roll double-side embossing. However, the alignment accuracy of the pattern on the positive and negative side in each embossing unit is one of the important factors of the embossing quality. Double-roller technology uses two rollers with the same diameter in theory, for the double-side alignment. But in fact, there is some error in the production of nip rollers, the diameter cannot be completely consistent, slight differences will be significantly enlarged after thousands of embossing, therefore the embossing pattern on the positive and negative side cannot be in counterpoint. In addition, the mold is coated on the nip roller, which will easily introduce angle error, lead to pattern rotation on one side, and lose double side counterpoint.

The other is double-side embossing technology with two flat molds, usually disposing two un-deforming flat molds on the positive and negative side of substrate, wherein the substrate is coated with embossing material on the positive and negative side, two molds and the substrate is closely attached and finish double-side embossing of a unit in vacuum. Although this method can implement the patterns alignment on the positive and negative side, but it requires the introduction of vacuum steps to remove air bubbles between the mold and the embossing material, and comprises two problems: (1) a confined space is needed to create a vacuum environment, (2) Vacuum pumping process will take long hours. These problems decide the method cannot implement rapidly roll-to-roll producing.

SUMMARY OF THE INVENTION

The present disclosure provides a UV curable resin embossing apparatus and method for roll to roll alignment, and solves the offset error accumulation of the corresponding patterns on the positive and negative side in existing double-side embossing technology.

Another object of the present disclosure is to solve the problem of the bubbles in embossing, which can be hardly eliminated.

The following technical schemes can be used to solve these technical problems in the present disclosure:

A UV curable resin embossing apparatus for roll to roll alignment, comprising a unrolling mechanism, a coating mechanism, a UV curable resin embossing mechanism, a stripping mechanism and a withdraw roll mechanism; wherein the apparatus further comprises an adjusting alignment mechanism comprising a flat mold supporting apparatus and an alignment probe, the flat mold supporting apparatus is capable of adjusting the position of a flat mold at three degrees of freedom including horizontal, vertical, and angle; the mold is disposed on the flat mold supporting apparatus, the UV curable resin embossing mechanism and the adjusting alignment mechanism are fixed to the UV curable resin embossing apparatus.

Alternatively, the UV curable resin embossing mechanism comprises a flat mold, a nip roller and an UV light from top to bottom; the UV light is disposed inside the nip roller and/or parallel to the UV light.

Alternatively, the flat supporting apparatus has air intakes.

A double-side embossing method of producing a transparent flexible substrate using the apparatus above, comprises:

I. coating a UV resin by the coating mechanism on a first side of the transparent flexible substrate;

II. sending the coated area of the first side of the transparent flexible substrate into the flat mold and the nip roller, and the coated area of the first side is opposite to the flat mold;

III. identifying the alignment mark on the second side of the transparent flexible substrate and the corresponding alignment mark on the flat mold by the alignment probe of adjusting alignment mechanism, controlling the flat mold supporting apparatus adjusting the position of the mold at three degrees of freedom including horizontal, vertical, and angle, and completing alignment;

IV. gradually pressing the aligned and UV resin coated first side of transparent flexible substrate to the flat mold with nip roller, and the UV light and the nip roller moving synchronously to complete the cure of UV resin; and V. the stripping mechanism stripping the transparent flexible substrate from one side of the flat mold towards the other side, and completing stripping.

Alternatively, the UV resin coating method in step II is any one of roller coating, screen printing coating or slit extrusion coating.

Alternatively, the alignment probe is disposed on the same side with the second side of the transparent flexible substrate in step III.

Alternatively, the rolling method comprises:

step 1, positioning the roller below the second side of the transparent flexible substrate initially, after alignment, the roller going up and rolling the transparent flexible substrate, and initially engaging one side of the flat mold to the second side of the transparent flexible substrate;

step 2, turning on the UV light, and curing the initially engaged UV resin;

step 3, the roller rolling from one side of the engaged point to the other side, and engaging the flat mold to the first side of the transparent flexible substrate, and curing synchronously.

step 4, the roller moving to the other side with a constant speed, and going back to the initial position after complete rolling.

Alternatively, the second side of the transparent flexible substrate already has pattern and alignment mark by embossing, and the second side of the transparent flexible substrate has a protective film.

The beneficial effect of the present disclosure is:

(1) The present disclosure can implement roll to roll double-side embossing, and compared with double-roller type, the position deviation of the pattern on the positive and negative side will not be periodically accumulated;

(2) Compared with the flat surface embossing, a vacuum environment is not needed in the roller way, thus the embossing hours can be saved, the structure can be simplified, and large area continuously embossing can be realized.

BRIEF DESCRIPTION OF THE DRAWINGS

The embodiment and the technical scheme used in the existing technical description will be briefly introduced as following, to illustrate the embodiment of the present disclosure or the technical scheme of the embodiment more clearly. Obviously, the following description of the drawings is just some embodiments of the present invention, for those skilled in the art, other drawings can be got without paying the creative labor according to these drawings.

DETAILED DESCRIPTION

Referring to the embodiment in the present disclosure, the technical scheme in the present disclosure will be clearly and completely described as following. Obviously, the described embodiments of the present disclosure are only a part of the embodiments, instead of all of the embodiments. All other embodiments of the present disclosure based on the embodiment in the present disclosure and obtained without the premise of creative work of those skilled in the art belong to the scope of protection.

Embodiment 1

Figure 1:
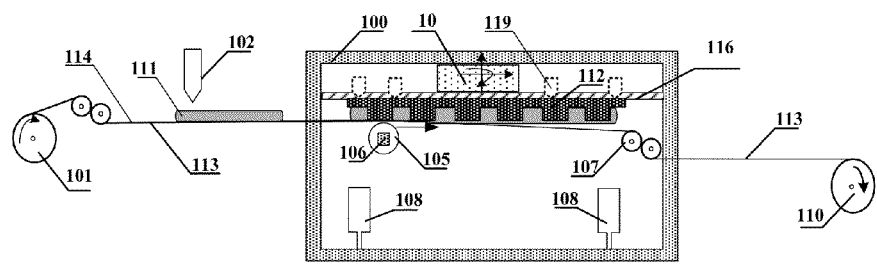
FIG. 1 illustrates a double-side embossing apparatus for embossing the transparent flexible substrate of the present disclosure.

FIG. 1 illustrates the apparatus of the present embodiment comprising an unrolling mechanism 101, a coating mechanism 102, a UV curable resin embossing mechanism 100, an adjusting alignment mechanism 10, a stripping mechanism 107 and a withdraw roll mechanism 110. The unrolling mechanism 101, the coating mechanism 102, and the UV curable resin embossing mechanism 100 are arranged in that order. The unrolling mechanism 101 dispenses a transparent flexible substrate 113, such as PC, sometimes referred to herein as PC 113, towards the coating mechanism 102. The UV coating mechanism 102 is a slit extrusion member fixed to the UV curable resin embossing apparatus 100 for applying a coating of a transparent UV resin 111 such as UV curable resin on the PC 113, and comprises a constant temperature feeding barrel, an output line and a slit coating point. The adjusting alignment mechanism 10 is received in the UV curable resin embossing mechanism 100 and comprises a flat mold supporting apparatus 116 and an alignment probe 108 opposite to the flat mold supporting apparatus 116; the flat mold supporting apparatus 116 has air intakes 119, shown schematically in FIG. 1, to suck the flat mold 112 with a suction of 5~7 kgf; the alignment probe 108 is a CCD image recording unit; the stripping mechanism 107 comprises two rollers which strip transparent flexible substrate 113 from flat mold 112 for take up on withdrawal roll mechanism 110.

As a further improvement, the UV curable resin embossing mechanism in the present disclosure comprise a flat mold 112, a nip roller 105 and an UV light 106 from top to bottom. The nip roller 105 is a silicon roller with 100 mm diameter and 1500 mm length, which presses PC 113 toward the flat mold 112 with 6 kgf force, thereby enabling the flat mold 112 to emboss the transparent UV resin 111. The movement speed of the nip roller 105 is 0.1~75 m/min, which can be adjusted. The UV light 106 is disposed inside the nip roller 105, and also may be arranged parallel to the nip roller 105. In this embodiment, the UV light 106 is disposed in the nip roller 105, with 70~150 W/cm intensity.

Embodiment 2

Figure 2:
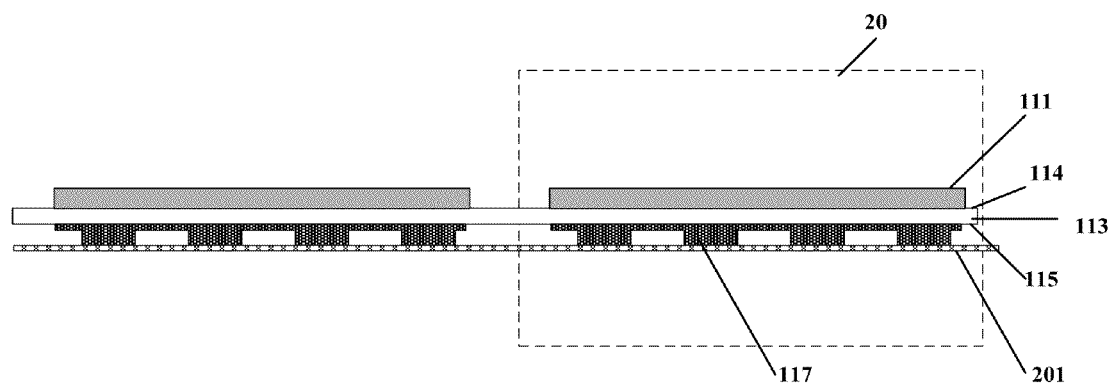
FIG. 2 illustrates two periods of the transparent flexible substrate structure after coating of the present disclosure.

Referring to FIG. 2, the transparent flexible substrate 113 according to the present embodiment is PC coiled material, i.e. PC 113, with 100 μm thickness and 1000mm width. It is different from FIG. 1; a periodic pattern 117 of transparent curable UV resin 111 and an alignment mark are already created on the negative side 115 of PC 113 via roll to roll single-side embossing, mold 112 not being shown in FIG. 2. In this example protective film 201 is a PE protective film; the transparent UV resin 111 coated on the positive side 114 of the PC 113 is prepared to be embossed, similar to the transparent UV resin 111 in FIG. 1, and the transparent UV resin 111 is UV curable resin, with a viscosity of 200~800 cps, 320~400 nm curing band and 800~1000 mj/cm2 curable agent amount.

Figure 3:
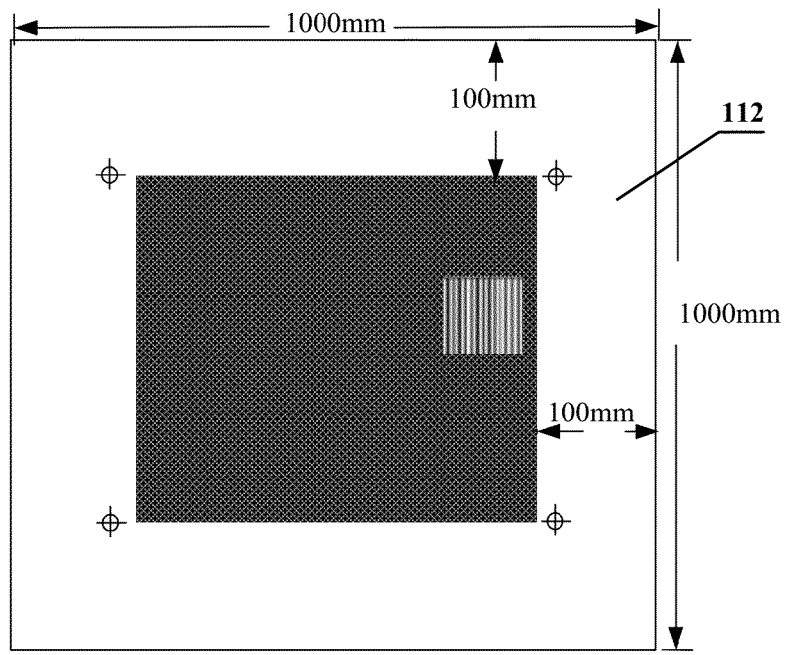
FIG. 3 illustrates the flat mold of the present disclosure.

Referring to FIG. 3, the flat mold 112 in the present embodiment, see FIG. 1, is a nickel mold with a thickness of 100 μm and an area of 1000 mm×1000 mm. The pattern is 800 mm×800 mm area, 1 μm width and 2 μm deepness thread grid.

Figure 4:
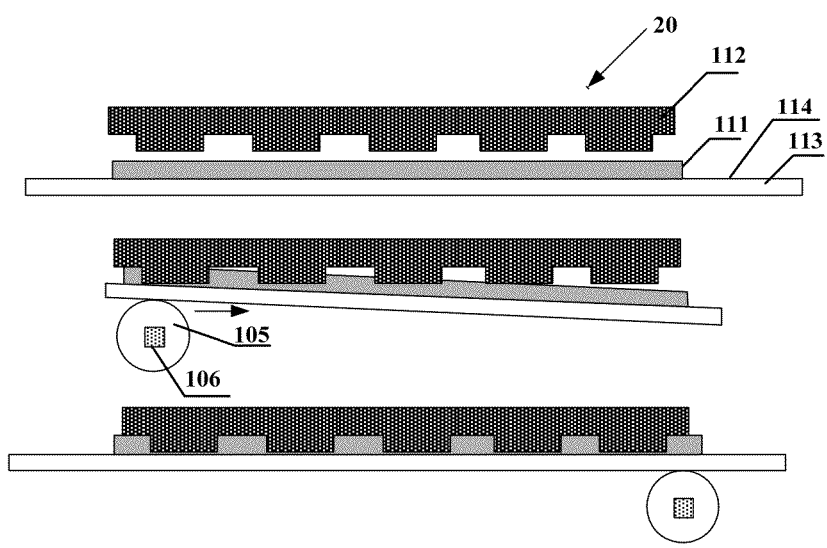
FIG. 4 illustrates the UV curable resin embossing process of the present disclosure.

Referring now primarily to FIG. 1 and FIG. 4, the unrolling mechanism 101 plays out PC 113, the slit coating mechanism 102 coats the UV curing resin 111 on the positive side 114 of transparent flexible substrate 113 with a coating thickness of 5~6 μm, an area of 1000 mm×1000 mm and an unit interval of 50 mm.

The operating unit 20 keeps moving into the UV curable resin embossing mechanism 100 of FIG. 1, until the alignment mark on one side of the second pattern of the operating unit is above the alignment probe 108 and the alignment mark on the other side is above the next alignment probe 108. The alignment probe 108 captures the alignment mark information on the second side 115 of the operating unit and the flat mold 112, and control the position of the flat mold supporting apparatus 116, which may adjust the position of the flat mold at three degrees of freedom including horizontal, vertical, and angle, thus overlap the alignment marks of the flat mold 112 and the second side pattern on the operating unit 20 with an alignment accuracy better than 50 μm.

Also referring to FIG. 4, the periodic pattern 116, the alignment mark, and the PE protective film 201 of FIG. 1 are not shown. FIG. 4 illustrates an embossing procedure on the positive side 114 of flexible substrate 113. The nip roller 105 is disposed on the left side of the operating unit 20 initially. After alignment, the nip roller 105 goes up and rolls the unit 20, and engaging the left side of the flat mold 112 to the left side of the operating unit 20. Then, turn on the UV light 106, and cure the engaged UV resin 111. Meanwhile, the operating unit 20 and the flat mold 112 will not slip relatively with the movement of the nip roller 105. The nip roller 105 rolls from the engaged point to the right, and engages the flat mold 112 and the PC 113 generally and cures both synchronously. The roller moves to the other side of the operating unit with a constant speed, and finishes the positive side embossing of the operating embossing. During the procedure, the bubbles between the flat mold 112 and the PC 113 are eliminated out of the flat mold 112, thus the method has good pattern copy accuracy. When rolling is completed, the nip roller 105 goes down to the initial position. The stripping mechanism 107 starts. The two rollers of stripping mechanism 107 go down, provide striping power, split the first positive side 114 of the transparent flexible substrate 113 from the flat mold 112, and form embossing pattern on the operating unit 20.

Rapidly roll to roll producing can be implemented by repeating the above steps.

Polyacrylate UV adhesive described in the embodiments can also be epoxy UV adhesive and all UV curing adhesive. The coating mechanism in the embodiments can be any one of roller coating, screen printing coating or slit extrusion coating.

Although the invention has been described in language specific to structural features and/or methodological acts, it is to be understood that the invention defined in the appended claims is not necessarily limited to the specific features or acts described. Rather, the specific features and acts are disclosed as sample forms of implementing the claimed invention.

What is claimed is:

1. A UV curable resin embossing apparatus for roll to roll alignment, comprising:
an unrolling mechanism (101), a coating mechanism (102), a UV curable resin embossing mechanism (100), a stripping mechanism (107) and a withdraw roll mechanism (110) arranged in that order; wherein the apparatus further comprises an adjusting alignment mechanism (10) received in the UV curable resin embossing mechanism 100, and the adjusting alignment mechanism (10) comprises a flat mold supporting apparatus (116) and an alignment probe (108) opposite to the flat mold supporting apparatus (116), the flat mold supporting apparatus (116) is capable of adjusting the position of a flat mold at three degrees of freedom including horizontal, vertical, and angle; the flat mold (112) is disposed on the flat mold supporting apparatus (116), the UV curable resin embossing mechanism (100) and the adjusting alignment mechanism (10) are fixed to the UV curable resin embossing apparatus.

2. The apparatus of claim 1, wherein the UV curable resin embossing mechanism (100) comprises the flat mold (112), a nip roller (105) and a UV light source (106); the UV light source (106) is disposed inside the nip roller (105) or parallel to the nip roller (105).

3. The apparatus of claim 1, wherein the flat mold supporting apparatus (116) has air intakes (119).

* * * * *

UNITED STATES PATENT AND TRADEMARK OFFICE
CERTIFICATE OF CORRECTION

PATENT NO. : 9,096,024 B2  
APPLICATION NO. : 14/000202  
DATED : August 4, 2015  
INVENTOR(S) : Ying Gu, Yulong Gao and Zheng Cui It is certified that error appears in the above-identified patent and that said Letters Patent is hereby corrected as shown below:

On the title page, item 71, delete applicant name "SUZHOU MONS-WAY PHOTOELECTRIC TECHNOLOGY LIMITED COMPANY, Suzhou, Jiangsu (CN)" and insert corrected applicant name -- NANCHANG O-FILM NANO-TECH CO., LTD., Nanchang, Jiangxi (CN) --

Signed and Sealed this  
Thirty-first Day of May, 2016

Michelle K. Lee  
*Director of the United States Patent and Trademark Office*